(12) United States Patent
Forbes et al.

(10) Patent No.: US 7,236,415 B2
(45) Date of Patent: Jun. 26, 2007

(54) SAMPLE AND HOLD MEMORY SENSE AMPLIFIER

(75) Inventors: Leonard Forbes, Corvallis, OR (US); David R. Cuthbert, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 10/931,786

(22) Filed: Sep. 1, 2004

(65) Prior Publication Data

US 2006/0044907 A1 Mar. 2, 2006

(51) Int. Cl.
*G11C 7/02* (2006.01)

(52) U.S. Cl. ............... 365/207; 365/205; 365/210; 365/212; 365/204; 365/202; 365/203

(58) Field of Classification Search ........... 365/207, 365/205, 210, 212, 204, 202, 203
See application file for complete search history.

(56) References Cited

U.S. PATENT DOCUMENTS

| | | | |
|---|---|---|---|
| 4,985,643 A | 1/1991 | Proebsting | |
| 5,237,533 A | 8/1993 | Papaliolios | |
| 5,568,440 A * | 10/1996 | Tsukude et al. | 365/222 |
| 5,708,622 A * | 1/1998 | Ohtani et al. | 365/233 |
| 5,818,750 A | 10/1998 | Manning | |
| 5,828,611 A | 10/1998 | Kaneko et al. | |
| 5,940,317 A | 8/1999 | Manning | |
| 5,995,163 A | 11/1999 | Fossum | |
| 6,052,307 A * | 4/2000 | Huber et al. | 365/185.21 |
| 6,115,316 A * | 9/2000 | Mori et al. | 365/230.03 |
| 6,141,239 A | 10/2000 | Manning | |
| 6,150,851 A | 11/2000 | Ohmi et al. | |
| 6,157,688 A * | 12/2000 | Tamura et al. | 375/348 |
| 6,166,367 A | 12/2000 | Cho | |
| 6,198,677 B1 | 3/2001 | Hsu et al. | |
| 6,246,622 B1 | 6/2001 | Sugibayashi | |
| 6,262,930 B1 * | 7/2001 | Mori et al. | 365/226 |
| 6,285,613 B1 | 9/2001 | Koya | |
| 6,288,575 B1 | 9/2001 | Forbes | |
| 6,304,505 B1 | 10/2001 | Forbes et al. | |
| 6,319,800 B1 | 11/2001 | Manning | |
| 6,341,088 B2 | 1/2002 | Sakamoto et al. | |
| 6,400,629 B1 * | 6/2002 | Barth et al. | 365/210 |
| 6,538,476 B2 | 3/2003 | Forbes | |

(Continued)

OTHER PUBLICATIONS

Parke, Stephen A., "Optimization of DRAM Sense Amplifiers for the Gigabit Era", *IEEE, Proceedings of the 40th Midwest Symposium on Circuits and Systems*, Sacramento, CA,(1997), pp. 209-212.

(Continued)

*Primary Examiner*—Viet Q. Nguyen
(74) *Attorney, Agent, or Firm*—Schwegman, Lundberg, Woessner & Kluth, P.A.

(57) ABSTRACT

A memory sense amplifier includes a sample and hold circuit followed by a differential amplifier. The sample and hold circuit samples a reference voltage on a bit line of a memory circuit when the sense amplifier is reset and a signal voltage on the same bit line when a signal representing a data bit is present in the bit line. The differential amplifier amplifies the difference between the signal voltage and the reference voltage.

44 Claims, 5 Drawing Sheets

U.S. PATENT DOCUMENTS

| | | |
|---|---|---|
| 6,759,657 B2 * | 7/2004 | Iida et al. .................. 250/332 |
| 6,803,794 B2 | 10/2004 | Martin et al. |
| 6,809,981 B2 | 10/2004 | Baker |
| 6,813,190 B2 | 11/2004 | Marotta et al. |
| 6,822,904 B2 | 11/2004 | Gallo et al. |
| 6,822,919 B2 | 11/2004 | Sahoo |
| 6,842,377 B2 | 1/2005 | Takano et al. |
| 6,861,634 B2 | 3/2005 | Rossi |
| 6,885,396 B1 | 4/2005 | Panicacci et al. |
| 6,885,580 B2 | 4/2005 | Baker |
| 6,912,167 B2 | 6/2005 | Tam |
| 6,920,060 B2 * | 7/2005 | Chow et al. ................ 365/145 |
| 6,937,052 B2 | 8/2005 | Tam |
| 2005/0002218 A1 | 1/2005 | Nazarian |
| 2005/0018060 A1 | 1/2005 | Takayanagi |
| 2006/0044903 A1 | 3/2006 | Forbes |

OTHER PUBLICATIONS

Rabaey, Jan M., *Digital Integrated Circuits: A Design Perspective, Section 10.4.2*, Prentice Hall Electronics and VLSI Series, (1996), 596-603.

Suh, Jung-Won, et al., "Offset-Trimming Bit-Line Sensing Scheme for Gigabit-Scale DRAM's", *IEEE Journal of Solid-State Circuits*, 31 (7), (Jul. 1996), pp. 1025-1028.

* cited by examiner

SAMPLE AND HOLD MEMORY SENSE AMPLIFIER

TECHNICAL FIELD

This document generally relates to memory sense amplifiers and particularly, but not by way of limitation, to a sense amplifier with a sample and hold circuit.

BACKGROUND

Sense amplifiers are used in memory devices to allow for reduced voltage swing on the bit lines. In a dynamic random access memory (DRAM) circuit, each data bit is stored in a small storage capacitor that is discharged quickly. A sense amplifier detects a signal representing the bit on a bit line and amplifies the signal to an amplitude near the DRAM circuit's supply voltage. The capacitor is recharged as the signal is amplified. The sense amplifier detects and amplifies the signal on a periodic basis, such as every few milliseconds, before the data bit ceases to be detectable.

In a known sense amplifier, a complementary pair of bit lines is precharged to the same potential in preparation for detecting and amplifying the signal representing the data bit. A reset circuit resets the sense amplifier by connecting all its inputs and outputs and the complementary pair of bit lines together to equalize their potentials. After the reset, the data bit is written onto one of the bit lines from the storage capacitor. The sense amplifier amplifies the difference between of voltages across the complementary pair of bit lines. The sensitivity and reliability of the sense amplifier depends on the equilibration of the complementary pair of bit lines during the reset. Because of mismatches in transistor characteristics and offsets in the sense amplifier, an offset voltage develops across the complementary pair of bit lines during the reset/equilibration. This offset voltage may be erroneously detected and amplified by the sense amplifier as a signal representing a data bit. Therefore, the sensitivity and reliability of the sense amplifier are limited.

There is a need for a sense amplifier with improved sensitivity and reliability.

SUMMARY

A memory sense amplifier includes a sample and hold circuit followed by a differential amplifier. The sample and hold circuit samples a reference voltage on a bit line of a memory circuit when the sense amplifier is reset and a signal voltage on the same bit line when a signal representing a data bit is present in the bit line. The differential amplifier amplifies the difference between the signal voltage and the reference voltage.

In one embodiment, a sense amplifier includes an input node, a sample and hold circuit, a differential amplifier, and a reset circuit. The input node is coupled to a bit line of a memory circuit to receive a precharging signal and then a data signal on the bit line. The precharging signal has a reference voltage. The data signal has a signal voltage and represents a data bit. The sample and hold circuit detects the reference voltage and the signal voltage. The differential amplifier amplifies the difference between the reference voltage and the signal voltage. The reset circuit resets the sense amplifier and precharges the bit line to the reference voltage.

In one embodiment, a method for refreshing a data bit on a bit line in a memory circuit is provided. The bit line is precharged to a reference voltage, whose value is then detected. The data bit is written onto the bit line. A signal voltage on the bit line, which is the amplitude of a signal representing the data bit, is detected. The difference between the detected signal voltage and the detected reference voltage is then amplified.

This Summary is an overview of some of the teachings of the present application and not intended to be an exclusive or exhaustive treatment of the present subject matter. Further details about the present subject matter are found in the detailed description and appended claims. Other aspects of the invention will be apparent to persons skilled in the art upon reading and understanding the following detailed description and viewing the drawings that form a part thereof, each of which are not to be taken in a limiting sense. The scope of the present invention is defined by the appended claims and their equivalents.

BRIEF DESCRIPTION OF THE DRAWINGS

The drawings illustrate generally, by way of example, but not by way of limitation, various embodiments discussed in the present document.

DETAILED DESCRIPTION

Figure 1:
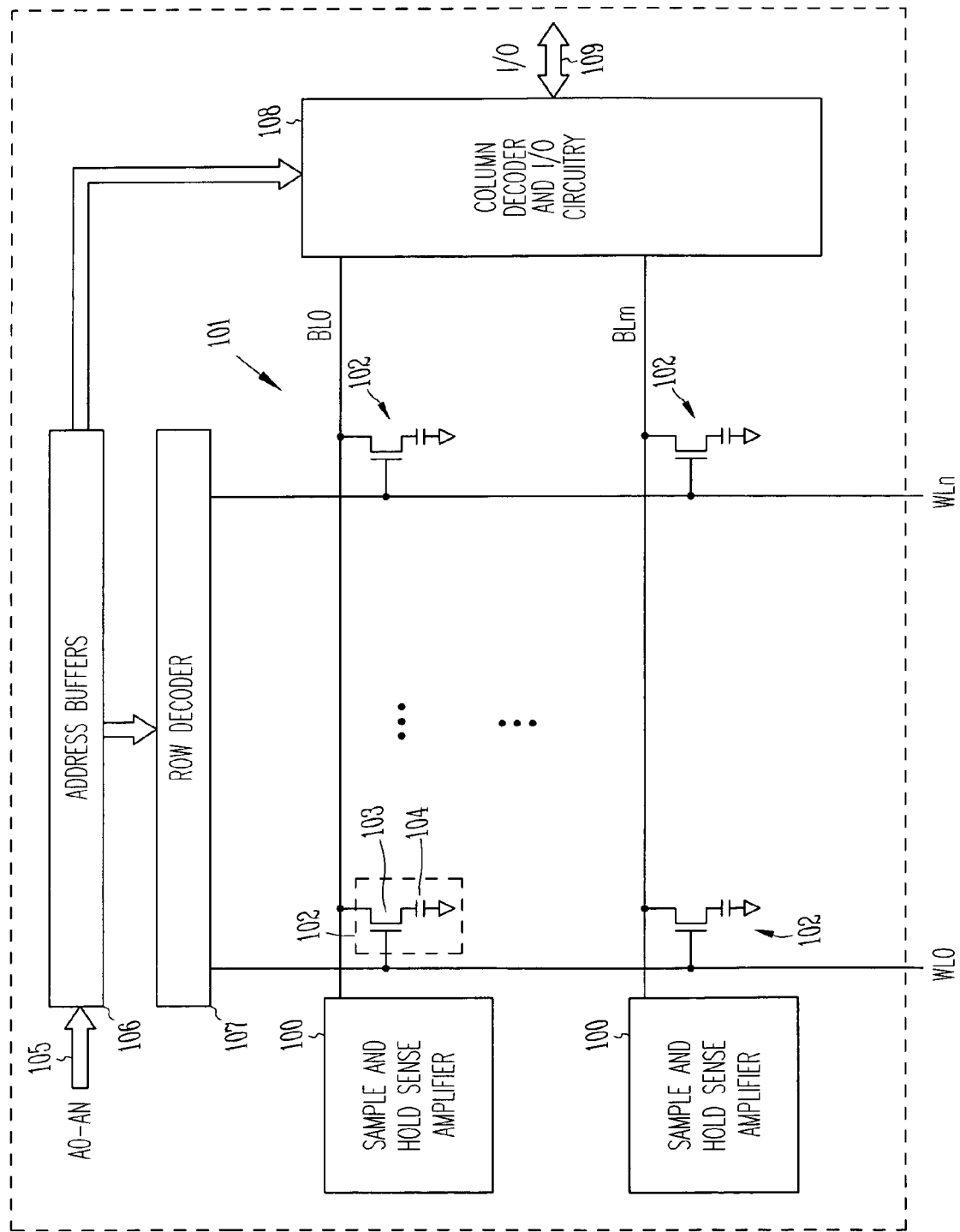
FIG. 1 is a block diagram illustrating an embodiment of portions of a memory circuit including a sample and hold sense amplifier circuit.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description provides examples, and the scope of the present invention is defined by the appended claims and their equivalents.

References to "an", "one", or "various" embodiments in this disclosure are not necessarily to the same embodiment, and such references contemplate more than one embodiment.

In this document, a "MOS transistor" refers to a metal-oxide semiconductor field-effect transistor (MOSFET). An "NMOS transistor" refers to an n-channel metal-oxide semiconductor field-effect transistor (or n-channel MOSFET). A "PMOS" refers to a p-channel metal-oxide semiconductor field-effect transistor (or p-channel MOSFET). Each MOS transistor (either NMOS or PMOS transistor) has a gate terminal, a drain terminal, and a source terminal. Other transistor structures can be used to form a sample and hold sense amplifier discussed in this document.

A CMOS differential amplifier illustrated in this document uses NMOS input transistors and PMOS load transistors. One of ordinary skill in the art will understand, upon reading and comprehending this disclosure, that the CMOS differential amplifier can instead use PMOS input transistors and NMOS load transistors or any other configuration and/or other types of transistors when considered suitable for specific applications. Transistor switches illustrated in this document use NMOS transistors. One of ordinary skill in the art will understand, upon reading and comprehending this disclosure, that other types of switches including, but not being limited to, PMOS transistor switches and other types of transistor switches, can be used for the switches.

This document discusses, among other things, a memory sense amplifier that includes a sample and hold circuit followed by a differential amplifier. The memory sense amplifier uses one bit line for reading and refreshing a data bit, eliminating the need for equilibrating a complementary pair of bit lines and the potential performance limitations and errors related to that need. The sample and hold circuit samples a reference voltage on a bit line when the sense amplifier is reset, holds the reference voltage, and samples a signal voltage on the same bit line when a data bit has been written onto the bit line. The differential amplifier amplifies the difference between the sampled signal voltage and the held reference voltage. A capacitor coupled between the sample and hold circuit and the amplifier circuit absorbs the effects of mismatches in transistor characteristics and offsets in the differential amplifier.

FIG. 1 is a block diagram illustrating an embodiment of portions of a memory circuit including sample and hold sense amplifiers 100. In one embodiment, the memory circuit is a DRAM circuit. The memory circuit includes a memory array 101 including rows and columns of memory cells 102. As illustrated in FIG. 1, memory array 101 has m rows and n columns, with bit lines BL0–BLm and word (address) lines WL0–WLn. Each of memory cells 102 is identified by one unique combination of a bit line (one of BL0–BLm) and a word line (one of WL0–WLn).

Bit lines BL0–BLm are used for writing data into and reading data from memory cells 102. Word lines WL0–WLn are address lines used for selecting the memory cells to which data are written into and from which the data are read from. Address buffers 106 receive address signals A0–An from address lines 105 connected to an external controller, such as a microprocessor coupled to the memory circuit. In response, address buffers 106 control row decoders 107 and column decoder and input/output circuitry 108 to access memory cells 102 selected according to address signals A0–An. Data provided at data input/outputs 109 are capable of being written into memory array 101. Data read from memory array 101 are applied to data input/outputs 109. Memory cells 102 each include a switch 103 and a storage capacitor 104. In one embodiment, switch 103 includes an n-channel field effect transistor, such as an NMOS transistor. The n-channel transistor has a drain terminal coupled to a bit line (one of BL0–BLm), a source terminal coupled to storage capacitor 104, and a gate terminal coupled to a word line (one of WL0–WLn).

To write or read data, address buffers 106 receive an address identifying a column of memory cells and select one of the word lines WL0–WLn according to the address. Row decoder 107 activates the selected word line to activate switch 103 of each cell connected to the selected word line. Column decoder and input/output circuitry 108 selects the particular memory cell for each data bit according to the address. To write data, each date bit at data input/outputs 109 causes storage capacitor 104 of one of the selected cells to be charged, or to stay discharged, to represent the data bit. To read data, a data bit stored in each of the selected cells, as represented by the charge state of storage capacitor 104 of the selected cell, is transferred to data input/outputs 109.

Sample and hold sense amplifiers 100 are each coupled to a bit line (one of BL0–BLm). Storage capacitor 104 in each of memory cells 102 has a small capacitance and holds a data bit charge for a limited time as the capacitor discharges. Sample and hold sense amplifiers 100 are used to "refresh" memory cells 102 by detecting and amplifying signals on the bit line that is connected to storage capacitor 104 when switch 103 is closed. As discussed in detail below, sample and hold sense amplifiers 100 each include a sample and hold circuit and a differential amplifier circuit. The sample and hold circuit detects a reference voltage precharged onto a bit line and a signal voltage on the bit line after a data bit is written onto the bit line (i.e., when switch 103 is closed). The differential amplifier circuit amplifies the difference between the signal voltage and the reference voltage. Using sample and hold amplifiers 100 eliminates the need for complementary pairs of bit lines, as in memory circuits with known sense amplifier configurations, and hence, eliminates the need for equilibrating each complementary pair of bit lines before detecting a signal representing the data bit.

Figure 2:
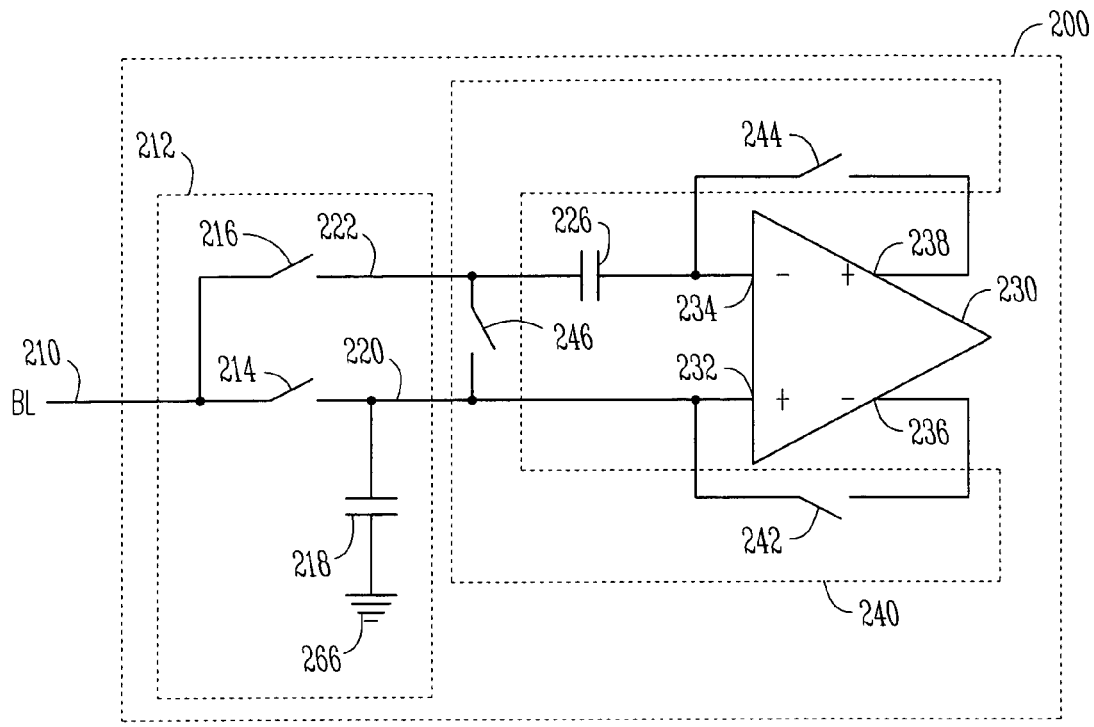
FIG. 2 is a circuit schematic illustrating an embodiment of the sample and hold sense amplifier circuit.

FIG. 2 is a circuit schematic illustrating an embodiment of a sample and hold sense amplifier circuit 200 coupled to a bit line BL. Sense amplifier 200 is an embodiment of sample and hold sense amplifier 100 and includes an input node 210, a sample and hold circuit 212, a coupling capacitor 226, a differential amplifier 230, and a reset circuit 240. BL represents one of the bit lines in a memory circuit, such as one of BL0–BLm in the memory circuit illustrated in FIG. 1.

Input node 210 is coupled to BL and receives signals present in BL, including a precharging signal having the reference voltage and a data signal having the signal voltage. The precharging signal precharges BL in preparation of sensing the data signal. The data signal is a signal representing a data bit.

Sample and hold circuit 212 is coupled to input node 210 to detect the reference voltage and the signal voltage. Sample and hold circuit 220 includes a sample and hold input coupled to input node 210, a first sample and hold output 220, and a second sample and hold output 222. The illustrated circuit includes switches logically controlled such that first sample and hold output 220 outputs the reference voltage, and second sample and hold output 222 outputs the signal voltage. A first sampling switch 214 is coupled between input node 210 and first sample and hold output 220. A second sampling switch 216 is coupled between input node 210 and second sample and hold output 222. A holding capacitor 218 is coupled between first sample and hold output 220 and a voltage reference node 266, such as a ground node. When BL is precharged to the reference voltage, first sampling switch 214 is closed to sample the reference voltage, which is then held by holding capacitor 218. The reference voltage is a potential between a logic high voltage and a logic low voltage. In one embodiment, the reference voltage is about one half of sense amplifier 200's positive supply voltage. First sampling switch 214 is then opened. After the data bit is written onto BL, second sampling switch 216 is closed to sample the signal voltage. When second sampling switch 216 is closed, the signal voltage is available at second sample and hold output 222, and the reference voltage (held by holding capacitor 218) is available at first sample and hold output 220. The data bit is thus ready to be refreshed by amplifying the difference between the signal voltage and the reference voltage.

Differential amplifier 230 amplifies the difference between the signal voltage and the reference voltage. Differential amplifier 230 includes a differential pair of amplifier inputs and a differential pair of amplifier outputs. The differential pair of amplifier inputs include a first amplifier input 232 and a second amplifier input 234. The differential pair of amplifier outputs includes a first amplifier output 236 and a second amplifier output 238. First amplifier input 232 is connected to first sample and hold output 220 to receive the reference voltage. Second amplifier input 234 is capacitively coupled to second sample and hold output 222 to receive the signal voltage.

In the illustrated embodiment, reset circuit 240 resets sense amplifier 200 to precharge BL to the reference voltage. Reset circuit 240 includes reset switches 242, 244, and 246. Reset switch 242 is coupled between first amplifier input 232 and first amplifier output 236. Reset switch 244 is coupled between second amplifier input 234 and second amplifier output 238. Reset switch 246 is coupled between first sample and hold output 220 and second sample and hold output 222. During a reset, reset switches 242 and 244 and at least two of reset switch 246 and sampling switches 214 and 216 are closed. This equalizes the potentials at first amplifier input 232, first amplifier output 236, first sample and hold output 220, second sample and hold output 222, input node 210, and BL, and separately, equalizes the potentials at second amplifier input 234 and second amplifier output 238.

Coupling capacitor 226 is coupled between second sample and hold output 222 and second amplifier input 234. During the reset, a voltage developed across coupling capacitor 226 compensates for the offset voltage across amplifier outputs 236 and 238 due to mismatches in transistor characteristics in differential amplifier 230. Thus, the effects of mismatches in transistor characteristics and offsets in differential amplifier 230 are absorbed by coupling capacitor 226, instead of being applied to BL, thus preventing potential sensing errors.

Figure 3:
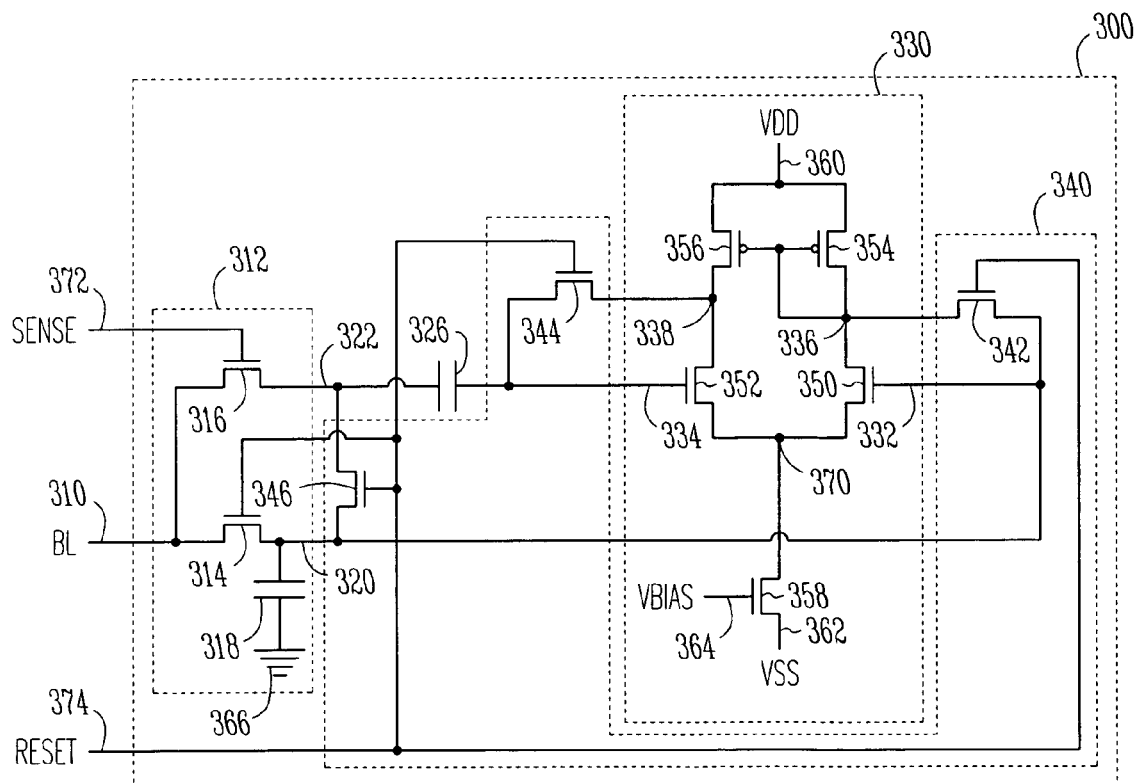
FIG. 3 is a circuit schematic illustrating a specific embodiment of the sample and hold sense amplifier circuit.

FIG. 3 is a circuit schematic illustrating an embodiment of a sample and hold sense amplifier circuit 300 coupled to a bit line BL. Sense amplifier 300 is a specific embodiment of sample and hold sense amplifier 200 and includes an input node 310, a sample and hold circuit 312, a coupled capacitor 326, a differential amplifier 330, and a reset circuit 340. BL represents one of the bit lines in a memory circuit, such as one of BL0–BLm in the memory circuit illustrated in FIG. 1.

Input node 310 is coupled to BL and receives signals present in BL, including a precharging signal having the reference voltage and a data signal having the signal voltage. The precharging signal precharges BL in preparation of sensing the data signal. The data signal is a signal representing a data bit.

Sample and hold circuit 312 is coupled to input node 310 to detect the reference voltage and the signal voltage. Sample and hold circuit 312 includes a sample and hold input coupled to input node 310, a first sample and hold output 320 to output the reference voltage, and a second sample and hold output 322 to output the signal voltage. A first sampling switch 314 is coupled between input node 310 and first sample and hold output 320. A second sampling switch 316 is coupled between input node 310 and second sample and hold output 322. In one embodiment, as illustrated in FIG. 3, sampling switch 314 includes an NMOS transistor having the drain terminal coupled to first sample and hold output 320 and the source terminal coupled to input node 310, and sampling switch 316 includes an NMOS transistor having the drain terminal coupled to second sample and hold output 322 and the source terminal coupled to input node 310. In other embodiments, sampling switches 314 and 316 each include a PMOS transistor or other types of transistors switches that are considered suitable by those skilled in the art for specific applications. A holding capacitor 318 is coupled between first sample and hold output 320 and a voltage reference node 366, such as a ground node. The bit line capacitance associated with BL is typically around 1 picofarad. Holding capacitor 318 is selected for a capacitance that is a fraction of the bit line capacitance, so as not to cause a large perturbation in voltage on BL. In one embodiment, holding capacitor 318 has a capacitance in a range of approximately 0.01 to 1.0 picofarads. In one specific embodiment, holding capacitor 318 has a capacitance of approximately 0.1 picofarads. First sampling switch 314 includes a switch control input coupled to a reset control line 374, such that the switch is driven by a reset control signal. In the embodiment in which first sampling switch 314 includes the NMOS transistor, the switch control input is the gate terminal of the NMOS transistor. While the reset control signal is present, BL is precharged to the reference voltage, and first sampling switch 314 is closed to sample the reference voltage, which is then held by holding capacitor 318. Second sampling switch 316 includes a switch control input coupled to a sense control line 372, such that the switch is driven by a sense control signal. In the embodiment in which second sampling switch 316 includes the NMOS transistor, the switch control input is the gate terminal of the NMOS transistor. The sense control signal is present after the data bit is written onto BL. While the sense control signal is present, second sampling switch 316 is closed to sample the signal voltage, and the reference voltage is held by holding capacitor 318. Thus, while the sense control signal is present, the signal voltage is available at second sample and hold output 322, while the reference voltage is available at first sample and hold output 320. The data bit is thus ready to be refreshed by amplifying the difference between the signal voltage and the reference voltage. In one embodiment, the sense control signal is also present when the reset control signal is present. During the reset, sample and hold outputs 320 and 322 are connected through a reset switch 346. Thus, in addition to first sampling switch 314, second sampling switch 316 also samples the reference voltage and charges holding capacitor 318 with the reference voltage during the reset.

Differential amplifier 330 amplifies the difference between the signal voltage and the reference voltage. Differential amplifier 330 includes a differential pair of amplifier inputs, including a first amplifier input 332 and a second amplifier input 334, and a differential pair of amplifier outputs, including a first amplifier output 336 and a second amplifier output 338. First amplifier input put 332 receives the reference voltage from first sample and hold output 320. Second amplifier input 334 receives the signal voltage from second sample and hold output 322 through coupling capacitor 326. In one embodiment, as illustrated in FIG. 3, differential amplifier 330 includes a CMOS differential amplifier having an NMOS differential input circuit and a PMOS load circuit. In an alternative embodiment, differential amplifier 330 includes a CMOS differential amplifier having a PMOS differential input circuit and an NMOS load circuit. In other alternative embodiments, differential amplifier 330 includes any differential amplifier considered suitable by those skilled in the art for specific applications. As illustrated in FIG. 3, differential amplifier 330 has a configuration including a differential input circuit coupled between a current mirror load circuit and a current source circuit. The differential input circuit includes a differentially coupled pair of NMOS input transistors 350 and 352. The gate terminal of NMOS input transistor 350 is coupled to first amplifier input 332. The gate terminal of NMOS input transistor 352 is coupled to second amplifier input 334. The drain terminal of NMOS input transistor 350 is coupled to first amplifier output 336. The drain terminal of second NMOS input transistor 352 is coupled to second amplifier output 338. The source terminals of NMOS input transistors 350 and 352 are coupled to a source node 370. The current mirror circuit includes PMOS load transistors 354 and 356. The gate terminals of PMOS load transistors 354 and 356 are coupled to the drain terminal of PMOS load transistor 354 and coupled to first amplifier output 336. The drain terminal of PMOS load transistor 356 is coupled to second amplifier output 338. The source terminals of PMOS load transistors 354 and 356 are coupled to a voltage reference node 360, which is coupled to a power supply line, VDD. The current source circuit includes an NMOS current source transistor 358. The gate terminal of NMOS current source transistor 358 is coupled to a voltage reference node 364, which is coupled to a bias voltage line VBIAS. The drain terminal NMOS current source transistor 358 is coupled to source node 370. The source terminal of NMOS current source transistor 358 is coupled to another voltage reference node 362, which is coupled to another power supply line, VSS.

Reset circuit 340 resets sense amplifier 300 to precharge BL to the reference voltage. Reset circuit 340 includes reset switches 342, 344, and 346. In one embodiment, as illustrated in FIG. 3, reset switches 342, 344, and 346 each include an NMOS transistor. In other embodiments, reset switches 342, 344, and 346 each include a PMOS transistor or other types of transistors switches that are considered suitable by those skilled in the art. Reset switch 342 is coupled between first amplifier input 332 and first amplifier output 336. Reset switch 344 is coupled between second amplifier input 334 and second amplifier output 338. Reset switch 346 is coupled between first sample and hold output 320 and second sample and hold output 322. Reset switches 342, 344, and 346 each include a switch control input coupled to reset control line 374, such that the switches are driven by the reset control signal. In the embodiment in which reset switches 342, 344, and 346 each includes the NMOS transistor, reset switch 342 includes a NMOS transistor having the drain terminal coupled to first amplifier input 332 and the source terminal coupled to first amplifier output 336, reset switch 344 includes a NMOS transistor having the drain terminal coupled to second amplifier output 338 and the source terminal coupled to second amplifier input 334, and reset switch 346 includes a NMOS transistor having the drain terminal coupled to first sample and hold output 320 and the source terminal coupled to second sample and hold output 322. The switch control input of each of reset switch 342, 344, and 346 is the gate terminal of the NMOS transistor. When the reset control signal is present, reset switches 342, 344, and 346, as well as first sampling switch 314, are closed. This equalizes the potentials at first amplifier input 332, first amplifier output 336, first sample and hold output 320, second sample and hold output 322, input node 310, and BL, and separately, equalizes the potentials at second amplifier input 334 and second amplifier output 338. In one embodiment, BL is precharged to a reference voltage that is about one half of sense amplifier 300's positive supply voltage, i.e., VDD/2.

Coupling capacitor 326 is coupled between second sample and hold output 322 and second amplifier input 334. In one embodiment, coupling capacitor 326 has a capacitance in a range of approximately 0.01 to 1.0 picofarads. In one specific embodiment, coupling capacitor 326 has a capacitance of approximately 0.1 picofarads. During the reset, a voltage developed across coupling capacitor 326 compensates for the offset voltage across amplifier outputs 336 and 338 due to mismatches in characteristics between NMOS input transistors 350 and 352 and/or between PMOS load transistors 354 and 356. Thus, the effects of mismatches in transistor characteristics and offsets in differential amplifier 330 are absorbed by coupling capacitor 326, instead of being applied to BL, thus preventing potential sensing errors.

Figure 4:
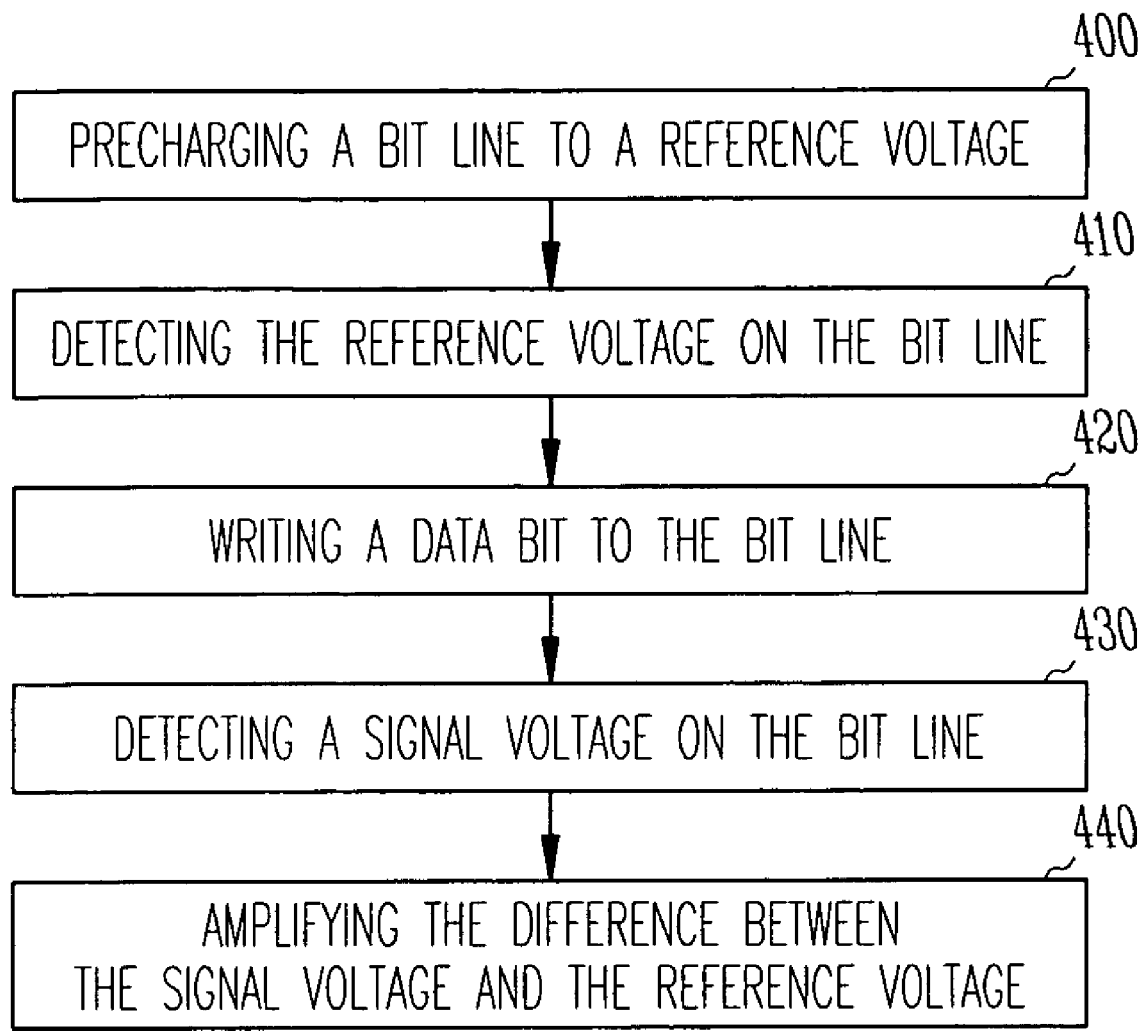
FIG. 4 is a flow chart illustrating an embodiment of a method for detecting and amplifying a date bit in a memory circuit.

FIG. 4 is a flow chart illustrating an embodiment of a method for detecting and amplifying a date bit in a memory circuit. Instead of using complementary pairs of bit lines, such as in known DRAM circuits, the method allows the memory circuit to use single bit lines instead of complementarily paired bit lines. In one embodiment, the method is performed with a sample and hold sense amplifier such as sense amplifier 200 or 300.

A bit line is precharged to a reference voltage at 400. This occurs while the sense amplifier is reset in response to a reset control signal. The reset control signal is produced after the data bit is amplified during each refreshing (i.e., sensing and amplifying) cycle. In one embodiment, by resetting the sense amplifier, the bit line is precharged to a voltage that approximately equals one half of the sense amplifier's positive supply voltage (VDD).

The reference voltage on the bit lines is detected at 410. In one embodiment, the reference voltage is sampled in response to the reset control signal and held until a sense control signal is present and while the sense control signal is present. The sense control signal is produced after the data bit is written onto the bit line during each refreshing cycle. In one embodiment, the sense control signal is also produced when the reset control signal is present.

The data bit is written onto the bit line at 420. In one embodiment, the data bit is stored in a storage capacitor of a memory cell. A switch coupled between the storage capacitor and the bit line is closed to produce a signal representing the data bit in the bit line.

A signal voltage on the bit line is detected at 430. The signal voltage is the amplitude of the signal representing the data bit in the bit line. In one embodiment, the signal voltage is sampled in response to the sense control signal. When the sense control signal is present, the signal voltage and the reference voltage are both available.

The difference between the signal voltage and the reference voltage is amplified at 440. In one embodiment, the difference between the signal voltage and the reference voltage is amplified by using a CMOS differential amplifier.

In one embodiment, immunity to effects of mismatches in transistor characteristics and offsets in the CMOS differential amplifier is provided by using a capacitor coupled between the differential inputs of the CMOS differential amplifier. The CMOS differential amplifier includes a pair of differential inputs and a pair of differential outputs. When the reset control signal is present, one differential input is connected to one differential output, and the other differential input is separately connected to the other differential output. The capacitor coupled between the two differential inputs absorbs the offset voltage that would otherwise apply onto the bit line to cause possible data sensing errors.

Figure 5:
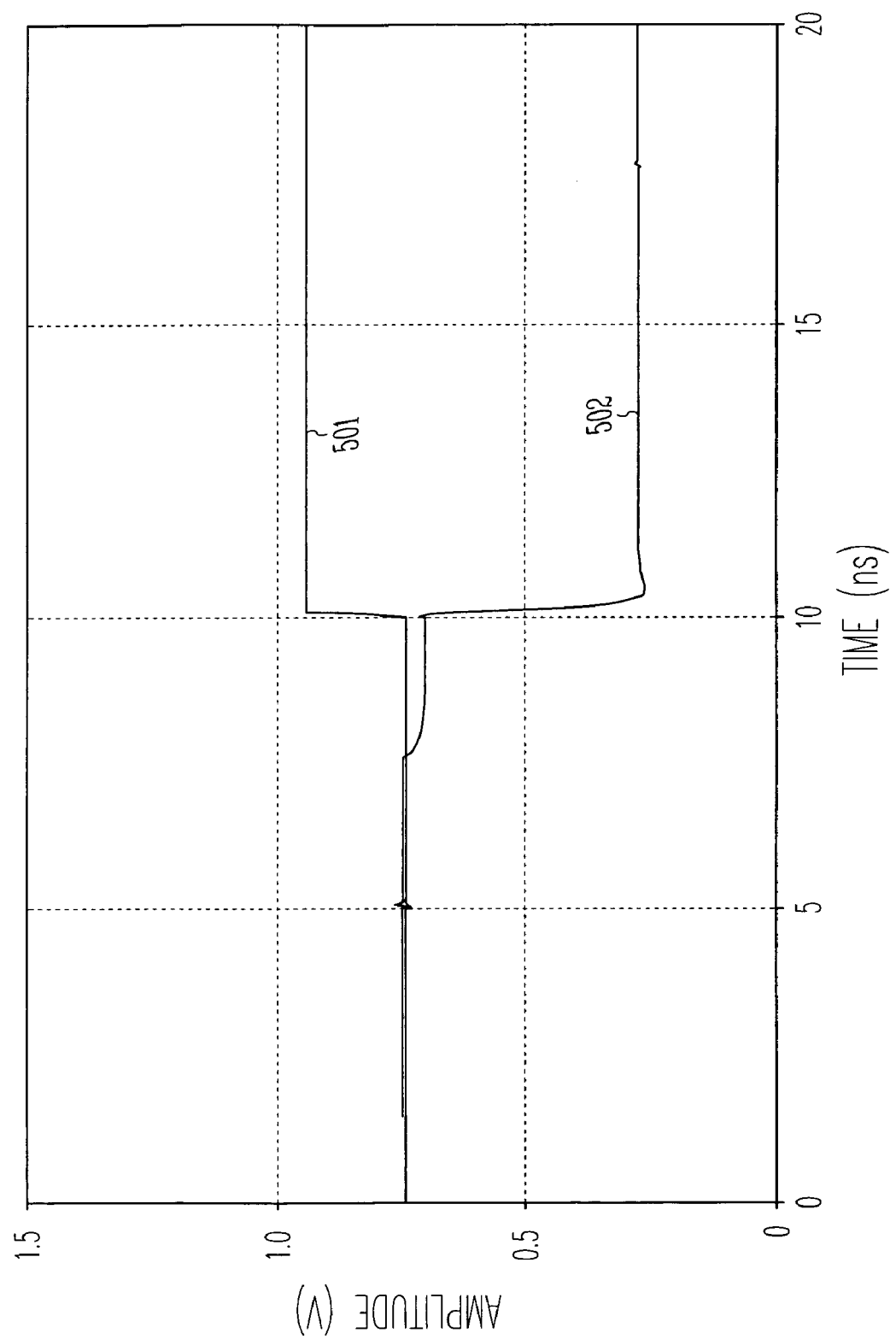
FIG. 5 is a graph showing simulation results illustrating the performance of the sample and hold sense amplifier circuit made with matched transistors.

FIG. 5 is a graph showing simulation results illustrating the performance of sample and hold sense amplifier circuit 300 made with matched transistors 350 and 352 and matched transistors 354 and 356. A VDD of 1.5 volts is applied to voltage reference node 360. A VSS of −0.75 volts is applied to voltage reference node 362. A reset control signal is present between 0 ns and 5 ns. A sense control signal is present after 7.5 ns and data is written onto the bit line at 10 ns.

A signal 501 represents a data bit signal on BL. A signal 502 shows the output voltage at second amplifier output 338. As shown in FIG. 5, the signal voltage (pulse amplitude of signal 501) is about 200 mV. The reference voltage is about 750 mV. After amplification, the output voltage (amplitude of signal 502 when the signal representing the data bit is present) is about 270 mV. The corresponding gain is about (750 mV−270 mV)/200 mV=2.40.

Figure 6:
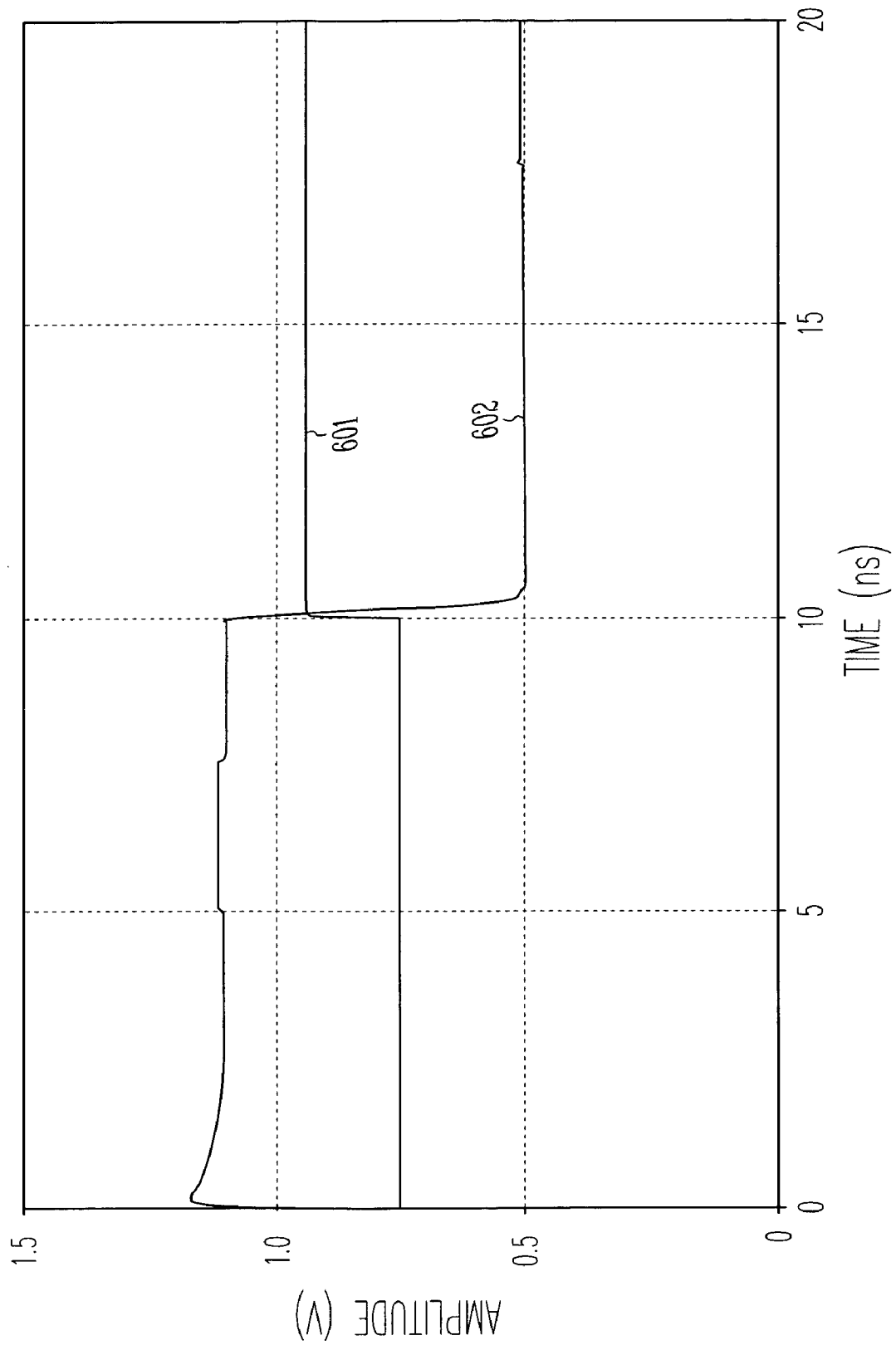
FIG. 6 is a graph showing simulation results illustrating the performance of the sample and hold sense amplifier circuit made with mismatched transistors.

FIG. 6 is a graph showing simulation results illustrating the performance of the sample and hold sense amplifier circuit 300 made with mismatched transistors 350 and 352 and matched transistors 354 and 356. A VDD of 1.5 volts is applied to voltage reference node 360. A VSS of −0.75 volts is applied to voltage reference node 362. A reset control signal is present between 0 ns and 5 ns. A sense control signal is present after 7.5 ns and data is written onto the bit line at 10 ns. NMOS input transistor 352 has a threshold voltage that is 400 mV higher than that of NMOS input transistor 350. All other transistor characteristic parameters are matched between transistors 350 and 352 and between transistors 354 and 356.

A signal 601 represents a data bit signal on BL. A signal 602 shows the output voltage at second amplifier output 338. As shown in FIG. 6, the signal voltage (pulse amplitude of signal 601) is about 200 mV. The reference voltage is about 750 mV. After amplification, the output voltage (amplitude of signal 602 when the signal representing the data bit is present) is about 500 mV. The corresponding gain is about (750 mV−500 mV)/200 mV=1.25. The 400-mV mismatch in threshold voltage, which is extremely high, causes signal 602 to start from an abnormally very high voltage and reduces the gain. However, after amplification, signal 602 represents a valid data output state, showing the effectiveness of coupling capacitor 326 in preventing data errors.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A sense amplifier coupled to a bit line in a memory circuit, the sense amplifier comprising:
    an input node, coupled to the bit line, to receive a precharging signal having a reference voltage and a data signal having a signal voltage;
    a sample and hold circuit, coupled to the input node, to detect the reference voltage and the signal voltage;
    a differential amplifier, coupled to the sample and hold circuit, to amplify a difference between the reference voltage and the signal voltage; and
    a reset circuit coupled to the sample and hold circuit and the differential amplifier, the reset circuit adapted to precharge the bit line to the reference voltage and reset the sense amplifier by equalizing potentials at an input of the differential amplifier, an output of the differential amplifier, and the bit line.

2. The sense amplifier of claim 1, further comprising a coupling capacitor, coupled between the sample and hold circuit and the differential amplifier, to absorb effects of mismatches in transistor characteristics and offsets in the differential amplifier.

3. The sense amplifier of claim 1, wherein the sample and hold circuit comprises a sample and hold input coupled to the input node, a first sample and hold output, and a second sample and hold output, the first sample and hold output adapted to output the reference voltage, the second sample and hold output adapted to output the signal voltage.

4. The sense amplifier of claim 3, wherein the differential amplifier comprises a differential pair of first and second amplifier inputs and a differential pair of first and second amplifier outputs, the first amplifier input coupled to the first sample and hold output, the second amplifier input coupled to the second sample and hold output.

5. The sense amplifier of claim 4, wherein the reset circuit comprises:
    a first reset switch coupled between the first amplifier input and the first amplifier output;
    a second reset switch coupled between the second amplifier input and the second amplifier output; and
    a third reset switch coupled between the first sample and hold output and the second sample and hold output.

6. The sense amplifier of claim 5, further comprising a coupling capacitor coupled between the second sample and hold output and the second amplifier input.

7. A memory circuit, comprising:
    a bit line; and
    a sense amplifier including:
        a sample and hold circuit coupled to the bit line;
        a differential amplifier;
        a coupling capacitor coupled between the sample and hold circuit and the differential amplifier; and
        a reset circuit coupled to the sample and hold circuit and the differential amplifier,
    the reset circuit adapted to precharge the bit line to a reference voltage.

8. The memory circuit of claim 7, wherein the sample and hold circuit comprises:
    a sample and hold input coupled to the bit line;
    a first sample and hold output;
    a second sample and hold output;
    a first sampling switch coupled between the sample and hold input and the first sample and hold output;
    a second sampling switch coupled between the sample and hold input and the second sample and hold output; and
    a holding capacitor coupled to the first sample and hold output.

9. The memory circuit of claim 8, wherein the holding capacitor has a capacitance in a range of approximately 0.01 to 1.0 picofarads.

10. The memory circuit of claim 8, wherein the differential amplifier is adapted to amplify a difference between voltages at the first sample and hold output and the second sample. and hold output.

11. The memory circuit of claim 10, wherein the differential amplifier comprises:
a first amplifier input;
a second amplifier input;
a first amplifier output; and
a second amplifier output,
wherein the first amplifier input is coupled to the first sample and hold output, and the coupling capacitor is coupled between the second sample and hold output and the second amplifier input.

12. The memory circuit of claim 11, wherein the reset circuit comprises:
a first reset switch coupled between the first amplifier input and the first amplifier output;
a second reset switch coupled between the second amplifier input and the second amplifier output; and
a third reset switch coupled between the first sample and hold output and the second sample and hold output.

13. The memory circuit of claim 12, further comprising a reset control line to receive a reset control signal and a sense control line to receive a sense control signal, wherein the first sampling switch includes a first sampling switch control input coupled to the reset control line, the second sampling switch includes a second sampling switch control input coupled to the sense control line, and the first, second, and third reset switches each include a reset switch control input coupled to the reset control line.

14. The memory circuit of claim 13, wherein the first sampling switch, the second sampling switch, the first reset switch, the second reset switch, and the third reset switch each comprise a MOS transistor.

15. The memory circuit of claim 11, wherein the coupling capacitor has a capacitance in a range of approximately 0.01 to 1.0 picofarads.

16. The memory circuit of claim 11, wherein the differential amplifier comprises:
a differential input circuit coupled to the first and second amplifier inputs and the first and second amplifier outputs;
a load circuit coupled to the differential input circuit; and
a current source circuit coupled to the differential input circuit.

17. The memory circuit of claim 16, wherein the differential amplifier comprises a CMOS differential amplifier.

18. The memory circuit of claim 17, wherein the differential input circuit comprises a differentially coupled pair of first and second NMOS input transistors each having gate, drain, and source terminals, the gate terminal of the first NMOS input transistor coupled to the first amplifier input, the gate terminal of the second NMOS input transistor coupled to the second amplifier input, the drain terminal of the first NMOS input transistor coupled to the first amplifier output, the drain terminal of the second NMOS input transistor coupled to the second amplifier output.

19. The memory circuit of claim 18, wherein the differential amplifier further comprises a first voltage reference node, and wherein the load circuit including a current mirror circuit coupled between the first voltage reference node and the differential input circuit, the current mirror circuit including first and second PMOS load transistors each having gate, drain, and source terminals, the gate terminals of the first and second PMOS load transistors coupled to the drain terminal of the first PMOS load transistor and coupled to the first amplifier output, the drain terminal of the second PMOS load transistor coupled to the second amplifier output, the source terminals of the first and second PMOS load transistors coupled to the first voltage reference node.

20. The memory circuit of claim 19, wherein the differential amplifier further comprises a source node coupled to the source terminals of the first and second NMOS input transistors, a second voltage reference node, and a current source circuit coupled between the source node and the second voltage reference node.

21. The memory circuit of claim 20, wherein the differential amplifier further comprises a third voltage reference node, and wherein the current source circuit comprises an NMOS transistor having a gate terminal coupled to the third voltage reference node, a drain terminal coupled to the source node, and a source terminal coupled to the second voltage reference node.

22. A method for refreshing a data bit on a bit line in a memory circuit, the method comprising:
producing a reset control signal;
precharging the bit line to a reference voltage;
detecting the reference voltage on the bit line while the reset control signal is present;
writing the data bit onto the bit line;
detecting a signal voltage on the bit line, the signal voltage being an amplitude of a signal representing the data bit; and
amplifying a difference between the detected signal voltage and the detected reference voltage.

23. The method of claim 22, further comprising producing a sense control signal and holding the detected reference voltage until and while the sense control signal is present, and wherein detecting the signal voltage comprises detecting a voltage on the bit line while the sense control signal is present.

24. The method of claim 23, wherein amplifying the difference between the detected signal voltage and the detected reference voltage comprises amplifying the difference between the detected signal voltage and the detected reference voltage while the sense control signal is present.

25. The method of claim 22, wherein precharging the bit line comprises resetting a sense amplifier coupled to the bit line.

26. The method of claim 25, wherein detecting the reference voltage comprises sampling a voltage on the bit line while the sense amplifier is being reset.

27. The method of claim 26, wherein detecting the reference voltage and detecting the signal voltage comprises sampling voltages on the bit line using a sample and hold circuit coupled to the bit line.

28. The method of claim 27, wherein amplifying the difference between the detected signal voltage and the detected reference voltage comprises using a CMOS differential amplifier.

29. The method of claim 28, further comprising compensating for effects of mismatches in transistor characteristics and offsets in the CMOS differential amplifier by using a capacitor coupled between differential inputs of the CMOS differential amplifier.

30. A method for making a memory sense amplifier, the method comprising:
providing a sense amplifier input to receive signals from a bit line;
connecting a sample and hold circuit to the sense amplifier input;
connecting an amplifier circuit to the sample and hold circuit;

connecting a coupling capacitor between the sample and hold circuit and the amplifier circuit; and providing a reset circuit to precharge the bit line to a reference voltage in preparation for sensing a signal representing a data bit.

31. The method of claim 30, wherein connecting the sample and hold circuit to the sense amplifier input comprises:
connecting a first sampling switch between the sense amplifier input and a first sample and hold output; and
connecting a second sampling switch between the sense amplifier input and a second sample and hold output.

32. The method of claim 31, wherein connecting the sample and hold circuit to the sense amplifier input further comprises connecting a holding capacitor between the first sample and hold output and a voltage reference node.

33. The method of claim 32, wherein connecting the holding capacitor comprises providing a capacitor having a capacitance in a range of approximately 0.01 to 1.0 picofarads.

34. The method of claim 32, wherein connecting the amplifier circuit to the sample and hold circuit comprises:
providing a CMOS differential amplifier having first and second differential inputs and first and second differential outputs;
connecting the first differential input to the first sample and hold output; and
connecting the second differential input to the second sample and hold output.

35. The method of claim 34, wherein providing the reset circuit comprises:
connecting a first reset switch between the first differential input and the first differential output;
connecting a second reset switch between the second differential input and the second differential output; and
connecting a third reset switch between the first sample and hold output and the second sample and hold output.

36. The method of claim 35, further comprising:
connecting a reset control line to the first sampling switch and the first, second, and third reset switches to drive the first sampling switch and the first, second, and third reset switches using a reset control signal; and
connecting a sense control line to the second sampling switch to drive the second sampling switch using a sense control signal.

37. The method of claim 36, wherein connecting the coupling capacitor between the sample and hold circuit and the amplifier circuit comprises connecting a coupling capacitor between the second sample and hold output and the second differential input.

38. The method of claim 37, wherein connecting the coupling capacitor comprises providing a capacitor having a capacitance in a range of approximately 0.01 to 1.0 picofarads.

39. A sense amplifier coupled to a bit line in a memory circuit, the sense amplifier comprising:
an input node, coupled to the bit line, to receive a precharging signal having a reference voltage and a data signal having a signal voltage;
a sample and hold circuit, coupled to the input node, to detect the reference voltage and the signal voltage;
a differential amplifier, coupled to the sample and hold circuit, to amplify a difference between the reference voltage and the signal voltage;
a coupling capacitor, coupled between the sample and hold circuit and the differential amplifier, to absorb effects of mismatches in transistor characteristics and offsets in the differential amplifier; and
a reset circuit coupled to the sample and hold circuit and the differential amplifier, the reset circuit adapted to precharge the bit line to the reference voltage.

40. The sense amplifier of claim 39, wherein:
the sample and hold circuit comprises a sample and hold input coupled to the input node, a first sample and hold output, and a second sample and hold output, the first sample and hold output adapted to output the reference voltage, the second sample and hold output adapted to output the signal voltage;
the differential amplifier comprises a differential pair of first and second amplifier inputs and a differential pair of first and second amplifier outputs, the first amplifier input coupled to the first sample and hold output, the second amplifier input coupled to the second sample and hold output; and
the coupling capacitor is coupled between the second sample and hold output and the second amplifier input.

41. The sense amplifier of claim 40, wherein the reset circuit comprises:
a first reset switch coupled between the first amplifier input and the first amplifier output;
a second reset switch coupled between the second amplifier input and the second amplifier output; and
a third reset switch coupled between the first sample and hold output and the second sample and hold output.

42. A sense amplifier coupled to a bit line in a memory circuit, the sense amplifier comprising:
an input node, coupled to the bit line, to receive a precharging signal having a reference voltage and a data signal having a signal voltage;
a sample and hold circuit, coupled to the input node, to detect the reference voltage and the signal voltage, the sample and hold circuit including a sample and hold input coupled to the input node, a first sample and hold output, and a second sample and hold output, the first sample and hold output adapted to output the reference voltage, the second sample and hold output adapted to output the signal voltage;
a differential amplifier, coupled to the sample and hold circuit, to amplify a difference between the reference voltage and the signal voltage, the differential amplifier including a differential pair of first and second amplifier inputs and a differential pair of first and second amplifier outputs, the first amplifier input coupled to the first sample and hold output, the second amplifier input coupled to the second sample and hold output; and
a reset circuit coupled to the sample and hold circuit and the differential amplifier, the reset circuit adapted to precharge the bit line to the reference voltage.

43. The sense amplifier of claim 42, wherein the reset circuit comprises:
a first reset switch coupled between the first amplifier input and the first amplifier output;
a second reset switch coupled between the second amplifier input and the second amplifier output; and
a third reset switch coupled between the first sample and hold output and the second sample and hold output.

44. The sense amplifier of claim 43, further comprising a coupling capacitor coupled between the second sample and hold output and the second amplifier input.

* * * * *

UNITED STATES PATENT AND TRADEMARK OFFICE
CERTIFICATE OF CORRECTION

| | | |
|---|---|---|
| PATENT NO. | : 7,236,415 B2 | Page 1 of 1 |
| APPLICATION NO. | : 10/931786 | |
| DATED | : June 26, 2007 | |
| INVENTOR(S) | : Forbes et al. | |

It is certified that error appears in the above-identified patent and that said Letters Patent is hereby corrected as shown below:

In column 11, line 4, in Claim 10, after "sample" delete ".".

Signed and Sealed this

Fourteenth Day of August, 2007

JON W. DUDAS
*Director of the United States Patent and Trademark Office*